(12) United States Patent
Hasegawa

(10) Patent No.: US 7,061,256 B2
(45) Date of Patent: Jun. 13, 2006

(54) METHOD AND APPARATUS FOR CONTACT RESISTANCE MEASUREMENT

(75) Inventor: Tomokazu Hasegawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/187,996

(22) Filed: Jul. 25, 2005

(65) Prior Publication Data

US 2006/0028221 A1    Feb. 9, 2006

(30) Foreign Application Priority Data

Jul. 26, 2004  (JP) .............................. 2004-217890

(51) Int. Cl.
*G01R 31/26* (2006.01)

(52) U.S. Cl. ..................................... 324/719

(58) Field of Classification Search ................ None
See application file for complete search history.

(56) References Cited

U.S. PATENT DOCUMENTS

| | | | | |
|---|---|---|---|---|
| 3,692,987 A | * | 9/1972 | Bos | ............................. 702/65 |
| 3,758,745 A | * | 9/1973 | Wilker et al. | .......... 219/121.68 |
| 4,876,515 A | * | 10/1989 | Ball | ........................... 324/538 |
| 5,446,395 A | * | 8/1995 | Goto | ........................... 324/763 |
| 5,715,147 A | * | 2/1998 | Nagano | ...................... 361/813 |
| 6,674,295 B1 | * | 1/2004 | Kamitani | .................... 324/713 |

FOREIGN PATENT DOCUMENTS

| | | |
|---|---|---|
| JP | 2-251162 | 10/1990 |
| JP | 8-330368 | 12/1996 |

* cited by examiner

*Primary Examiner*—Vinh Nguyen
*Assistant Examiner*—Richard Isla-Rodas
(74) *Attorney, Agent, or Firm*—McGinn IP Law Group, PLLC

(57) ABSTRACT

A contact resistance measurement method is composed of: placing a first probe onto a first pad connected to an integrated circuit; placing a second probe onto a second pad electrically connected to the first pad; placing a third probe onto a third pad electrically connected to the first pad; measuring a first resistance between the first and second probes; measuring a second resistance between the second and third probes; measuring a third resistance between the third and first probes. A contact resistance between the first probe and the first pad is calculated from the first to third resistances.

10 Claims, 5 Drawing Sheets

METHOD AND APPARATUS FOR CONTACT RESISTANCE MEASUREMENT

BACKGROUND OF THE INVENTION

1. Field of the Invention

The present invention relates to a method and apparatus for measuring contact resistances between probes and bonding pads on a semiconductor wafer.

2. Description of the Related Art

Probe testing of integrated circuits requires appropriate management of contact resistances between test probes and bonding pads. The contact resistance between a probe and a bonding pad often suffers from undesirable increase due to various causes, such as wearing and pollution of the probe tip. The increase in the contact resistance may cause inaccurate measurement of integrated circuit characteristics, and therefore monitoring the contact resistance between the probe and the bonding pad is important for appropriate maintenance of the probe tip.

Japanese Laid Open Patent Application No. H02-251162A discloses a technique for contact resistance measurement between probes and bonding pads. This technique involves measuring contact resistances between probes and bonding pads using contact resistance measuring pads which are additionally provided on a semiconductor chip. The above-mentioned application discloses that each bonding pad is connected to one contact resistance measuring pad.

Japanese Laid Open Patent Application No. H08-330368A discloses another technique for measuring contact resistances between probes and bonding pads, in which a pair of monitoring pads are provided for each bonding pad, and used for the contact resistance measurement. The advantage of this technique is that the measured contact resistances between the bonding pads and the probes are almost free from the influence of the contact resistances between the monitoring pads and the probes.

Appropriate management of the contact resistances between probes and contact resistance measuring pads is advantageous in the contact resistance measurement between the probes and the bonding pads. Although being not critical, the increase in the contact resistances between probes and contact resistance measuring pads is undesirable. In order to avoid this, obtaining data indicative of contact resistances between probes and contact resistance measuring pads is advantageous for the appropriate maintenance of the probes, especially, the conditions of the probe tips.

Therefore, there is a need for providing a contact resistance measurement technique which allows obtaining data indicative of contact resistances between probes and contact resistance measuring pads.

SUMMARY OF THE INVENTION

In an aspect of the present invention, a contact resistance measurement method is composed of:

placing a first probe on a first pad connected to an integrated circuit;

placing a second probe on a second pad electrically connected to said first pad;

placing a third probe on a third pad electrically connected to said first pad;

measuring a first resistance between said first and second probes;

measuring a second resistance between said second and third probes;

measuring a third resistance between said third and first probes; and calculating a contact resistance between said first probe and said first pad from said first to third resistances.

The contact resistance measurement method thus designed allows calculating the contact resistances between the second probe and the second pad and between the third probe and the third pad, in addition to the contact resistance between the first probe and the first pad, because this method involves measuring the first to third resistances, which can be used for calculating the complete set of the contact resistances. This effectively provides improved control of the contact resistances between the probes and pads.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
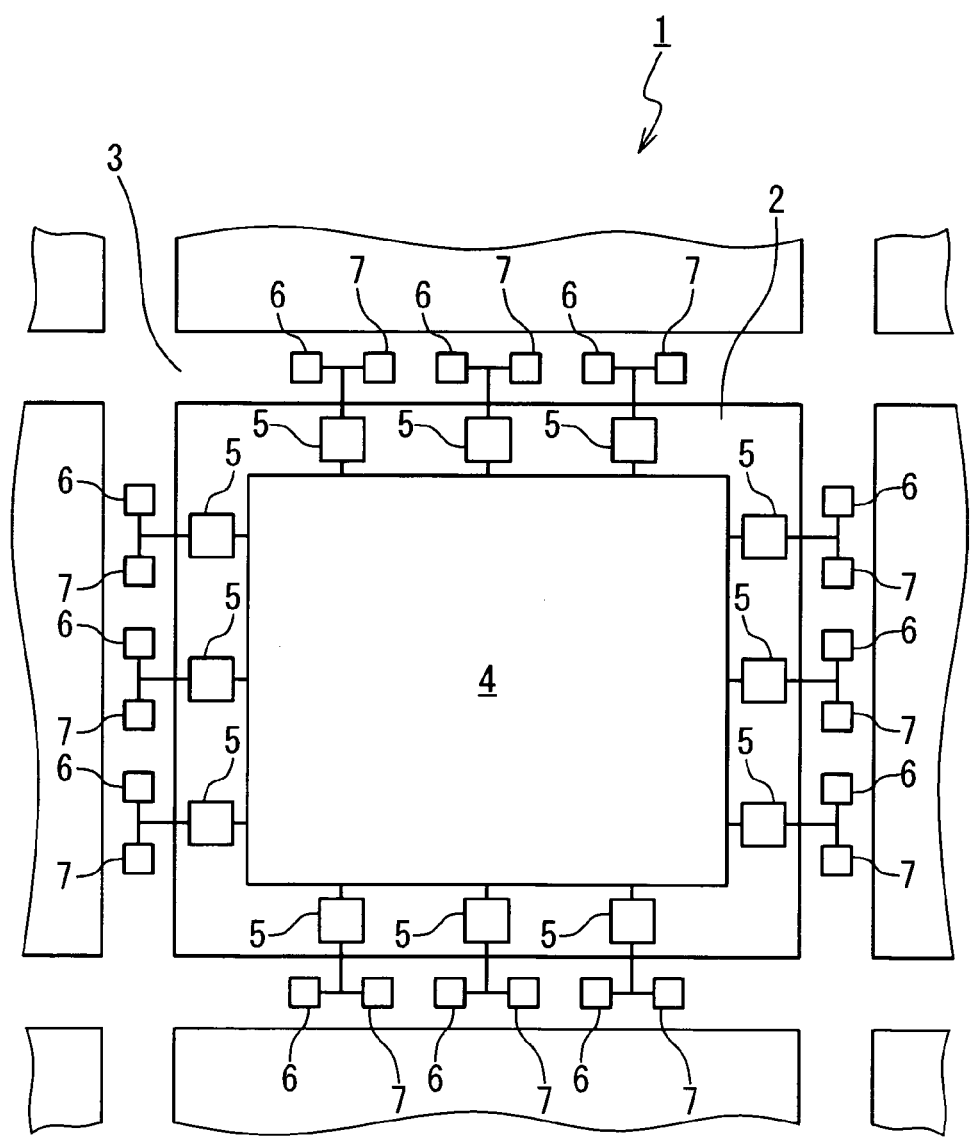
FIG. 1 is an exemplary structure of a semiconductor wafer in one embodiment of the present invention.

In one embodiment, as shown in FIG. 1, a semiconductor wafer 1 is subjected to a contact resistance test before a probing test of circuits integrated therein. The semiconductor wafer 1 is composed of a chip area 2 and scribe lanes 3. The chip area 2 is an area to be machined into a semiconductor chip through dicing. The chip area 2 is provided with an integrated circuit 4 and bonding pads 5. The bonding pads 5 are connected to the integrated circuit 4 to provide signal interface thereto. When the integrated circuit 4 is probe-tested, test probes are placed on the bonding pads 5. The scribe lanes 3 are disposed to provide areas where the semiconductor wafer 1 is cut.

Auxiliary pads 6 and 7 are provided on the semiconductor wafer 1 to achieve measurement of contact resistances between bonding pads 5 and test probes connected thereto. The auxiliary pads 6 and 7 are connected to the associated bonding pads 5.

It is preferable that at least portions of the auxiliary pads 6 and 7 are positioned in the scribe lanes 3. It would be further preferable if the whole of the auxiliary pads 6 and 7 are positioned in the scribe lanes 3; FIG. 1 illustrates the structure of the semiconductor wafer 1 in which the whole of the auxiliary pads 6 and 7 are positioned in the scribe lanes 3. The auxiliary pads 6 and 7 are not used for signal interface to the integrated circuit 4. Therefore, providing the auxiliary pads 6 and 7 in the scribe lanes 3 is effective for reducing the size of the chip area 2.

Figure 2:
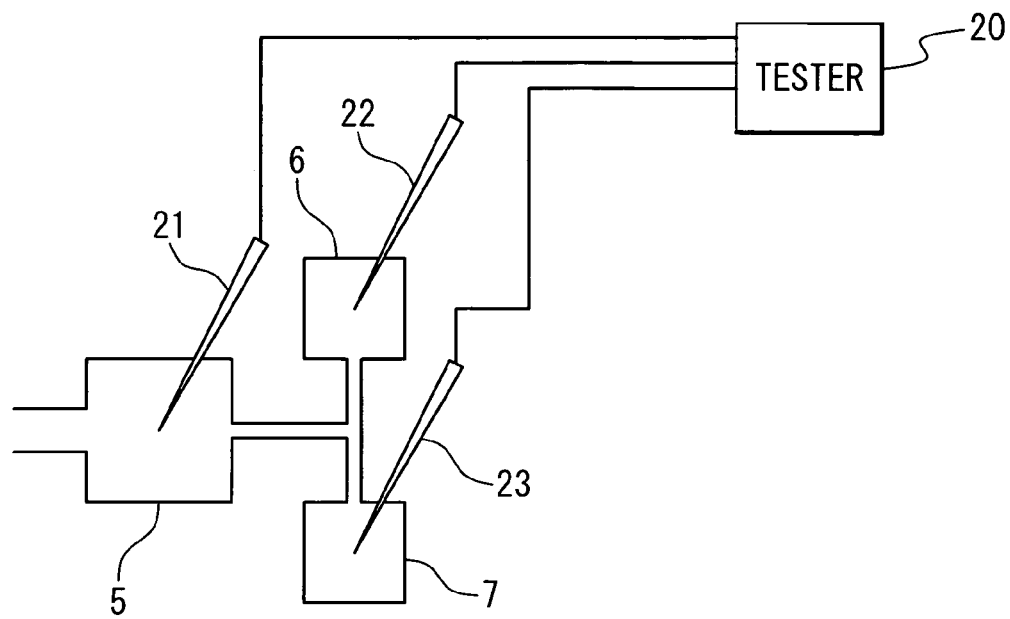
FIG. 2 is a conceptual diagram illustrating a contact resistance measurement method in this embodiment.

FIG. 2 conceptually illustrates a method for measuring the contact resistance in this embodiment. Probes 21 are placed on the respective bonding pads 5 when the integrated circuit 4 is probe-tested. A tester 20 testing the integrated circuit 4 provides test signals for the integrated circuit 4 through the probes 21 and/or receives output signals from the integrated circuit 4.

Figure 3:
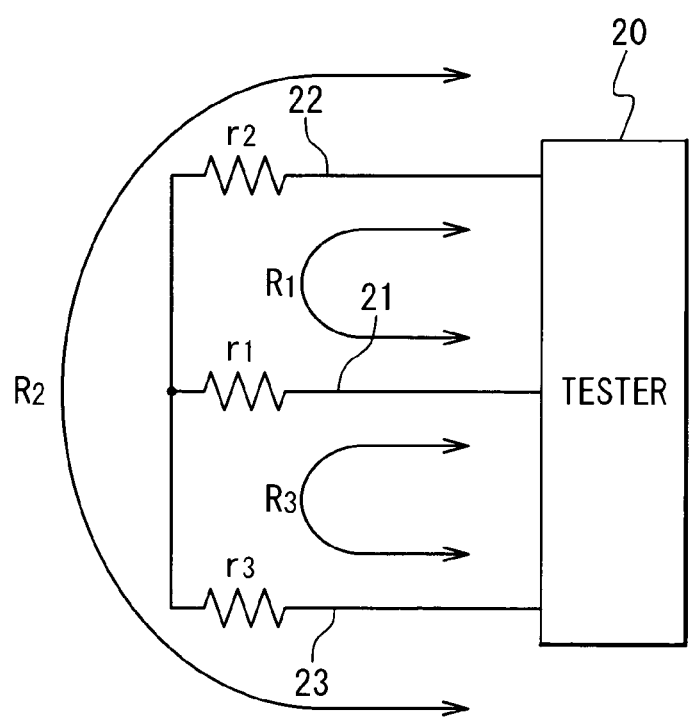
FIG. 3 is an equivalent circuit diagram illustrating the contact resistance measurement method in this embodiment.

To measure contact resistances between the bonding pads 5 and the probes 21, auxiliary probes 22 and 23 are placed on the auxiliary pads 6 and 7. FIG. 3 is an equivalent circuit diagram illustrating the contact resistance measurement method in this embodiment. In FIG. 3, the symbol r1 denotes the contact resistance between the relevant bonding pad 5 and probe 21. Correspondingly, the symbol r2 denotes the contact resistance between the relevant auxiliary pad 6 and auxiliary probe 22, and the symbol r3 denotes the contact resistance between the relevant auxiliary pad 7 and auxiliary probe 23.

When indicated to initiate the contact resistance measurement, the tester 20 measures the resistance $R_1$ between the probe 21 and the auxiliary probe 22, the resistance $R_2$ between the auxiliary probes 22 and 23, and the resistance $R_3$ between the auxiliary probe 23 and the probe 21. The auxiliary probe 23 is placed into the high impedance (Hi-Z) state during the measurement of the resistance $R_1$ between the probe 21 and the auxiliary probe 22. Correspondingly, the probe 21 is placed into the high impedance state during the measurement of the resistance $R_2$ between the auxiliary probes 22 and 23, and the auxiliary probe 22 is placed into the high impedance state during the measurement of the resistance $R_3$ between the auxiliary probe 23 and the probe 21.

The resistance $R_1$ between the probe 21 and the auxiliary probe 22 is identical to the sum of the contact resistance r1 between the probe 21 and the bonding pad 5, and the contact resistance r2 between the auxiliary probe 22 and the auxiliary pad 6. Correspondingly, the resistance $R_2$ between the auxiliary probes 22 and 23 is identical to the sum of the aforementioned contact resistance r2 and the contact resistance r3 between the auxiliary probe 23 and the auxiliary pad 7, and the resistance $R_3$ between the auxiliary probe 23 and the probe 21 is identical to the sum of the contact resistances r3 and r1.

In other words, the following equations hold:

$$R_1 = r1 + r2, \quad (1a)$$

$$R_2 = r2 + r3, \text{ and} \quad (1b)$$

$$R_3 = r3 + r1. \quad (1c)$$

From the equations (1a) to (1c), the following equation (2) is obtained:

$$r1 + r2 + r3 = (R_1 + R_2 + R_3)/2. \quad (2)$$

From the equations (2) and (1b), the following equation (3) is obtained to represent the contact resistance r1 between the probe 21 and the bonding pad 5:

$$r1 = (R_1 - R_2 + R_3)/2. \quad (3)$$

The equation (3) is used to calculate the contact resistance r1 from the measured resistances $R_1$ to $R_3$.

One advantage of this measurement method is that this measurement method involves obtaining data necessary for calculating the contact resistance r2 between the auxiliary pad 6 and the auxiliary probe 22, and the contact resistance r3 between the auxiliary pad 7 and the auxiliary probe 23. If necessary, the contact resistances r2 and r3 are obtainable from the following equations (4a) and (4b):

$$r2 = (R_1 + R_2 - R_3)/2, \text{ and} \quad (4a)$$

$$r3 = (-R_1 + R_2 + R_3)/2. \quad (4b)$$

The fact that the contact resistances r2 and r3 are obtainable from the measured resistances $R_1$ to $R_3$ is advantageous for achieving appropriate maintenance of the auxiliary probes 22 and 23.

Figure 4:
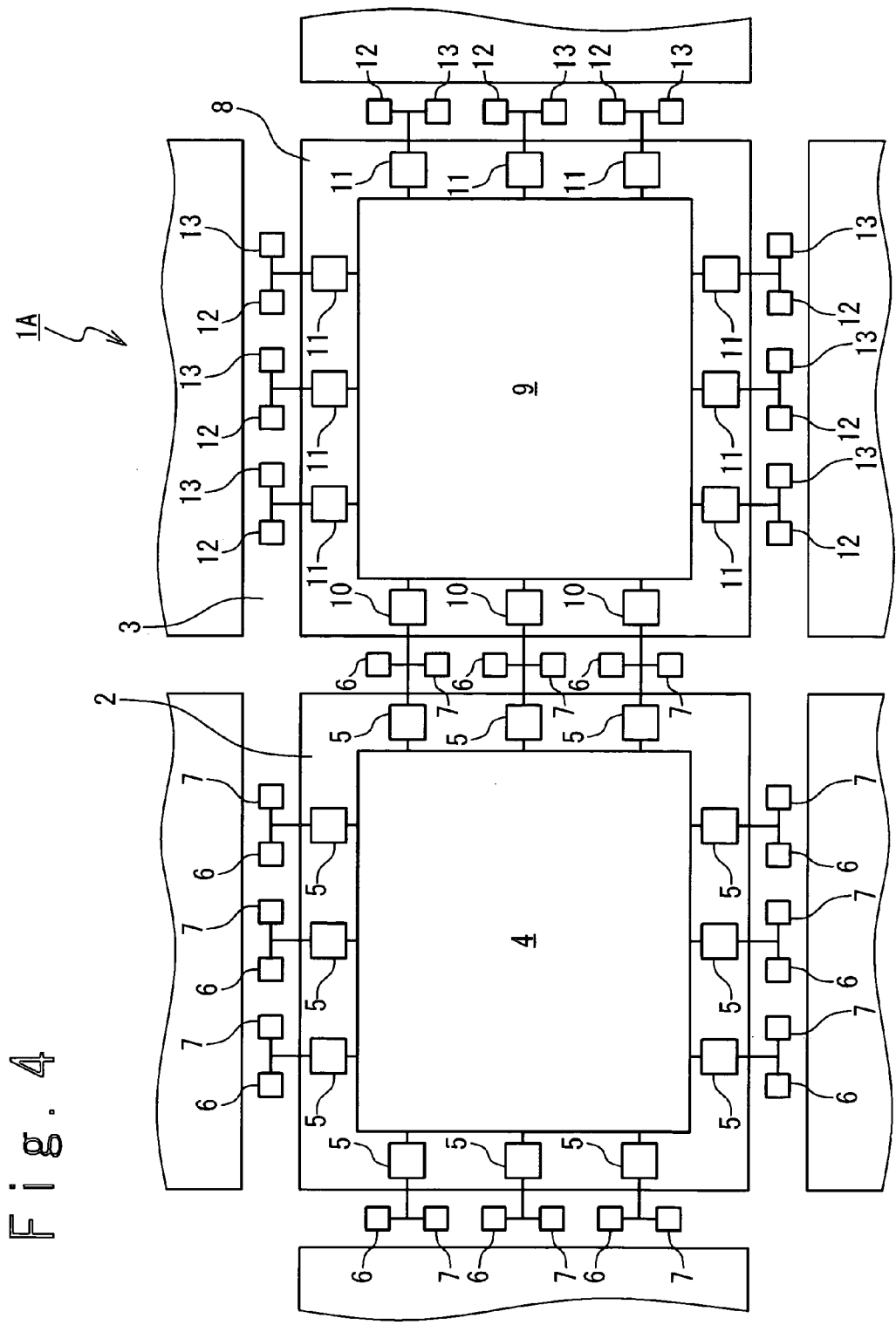
FIG. 4 is an exemplary structure of a semiconductor wafer in an alternative embodiment of the present invention.

In an alternative embodiment, as shown in FIG. 4, a semiconductor wafer 1A is provided with a pair of chip areas 2 and 8 adjacent to each other, te chip area 8 including another integrated circuit 9. In this embodiment, the chip areas 2 and 8 are subjected to the contact resistance measurement between bonding pads and probes. Among the bonding pads disposed within the chip area 8, the bonding pads adjacent to the chip area 2 are denoted by numeral 10, while the remaining bonding pads are denoted by numeral 11. The bonding pads 10 and 11 are both used for signal interface to the integrated circuit 9.

The bonding pads 11, which are positioned not to be adjacent to the chip area 2, are connected to auxiliary pads 12 and 13. The auxiliary pads 12 and 13 are used to measure contact resistances between the bonding pads 11 and probes connected thereto.

On the other hand, the contact resistance measurement between the bonding pads 10 and probes connected thereto is achieved by using the auxiliary pads 6 and 7 disposed between the chip areas 2 and 8. This implies that the auxiliary pads 6 and 7 are used for both of the contact resistance measurement related to the bonding pads 5, disposed in the chip area 2, and the contact resistance measurement related to the bonding pads 10, disposed in the chip area 8. Such arrangement of the bonding pads 5, 10, the auxiliary pads 6, and 7 are effective for reducing the total area size necessary for disposing the auxiliary pads used for contact resistance measurement. It is importance to reduce the total area size of the auxiliary pads, especially in the case that many bonding pads are disposed in the chip areas 2 and 8.

Figure 5:
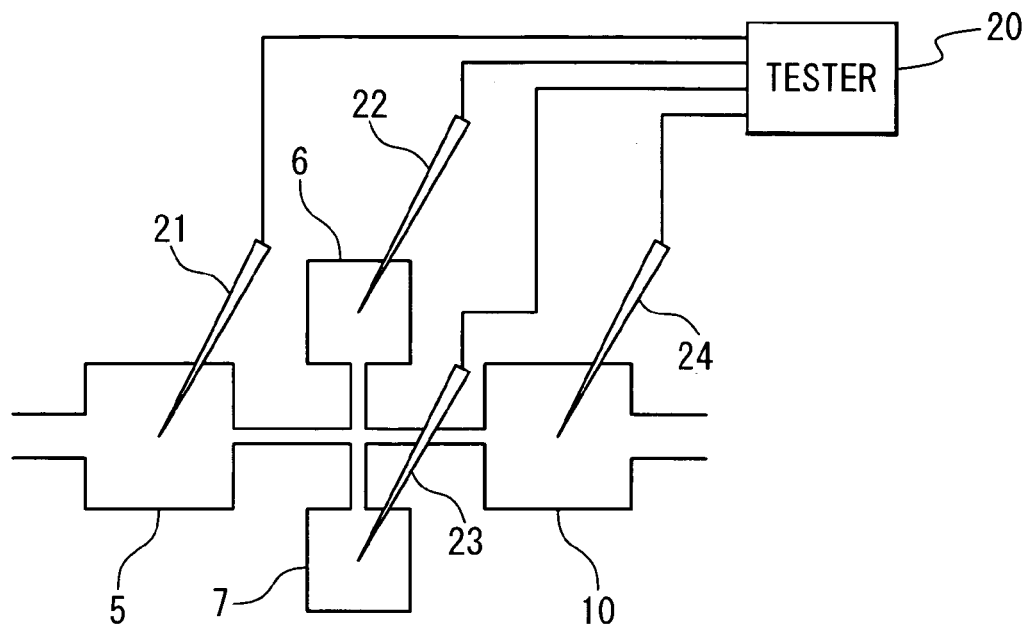
FIG. 5 is a conceptual diagram illustrating a contact resistance measurement method in the alternative embodiment.
Figure 6:
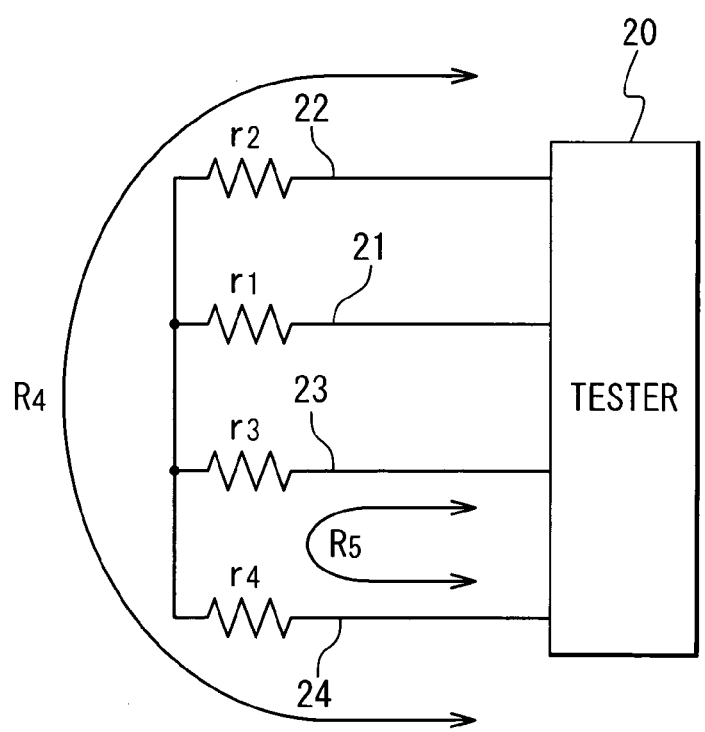
FIG. 6 is an equivalent circuit diagram illustrating the contact resistance measurement method in the alternative embodiment.
Figure 7:
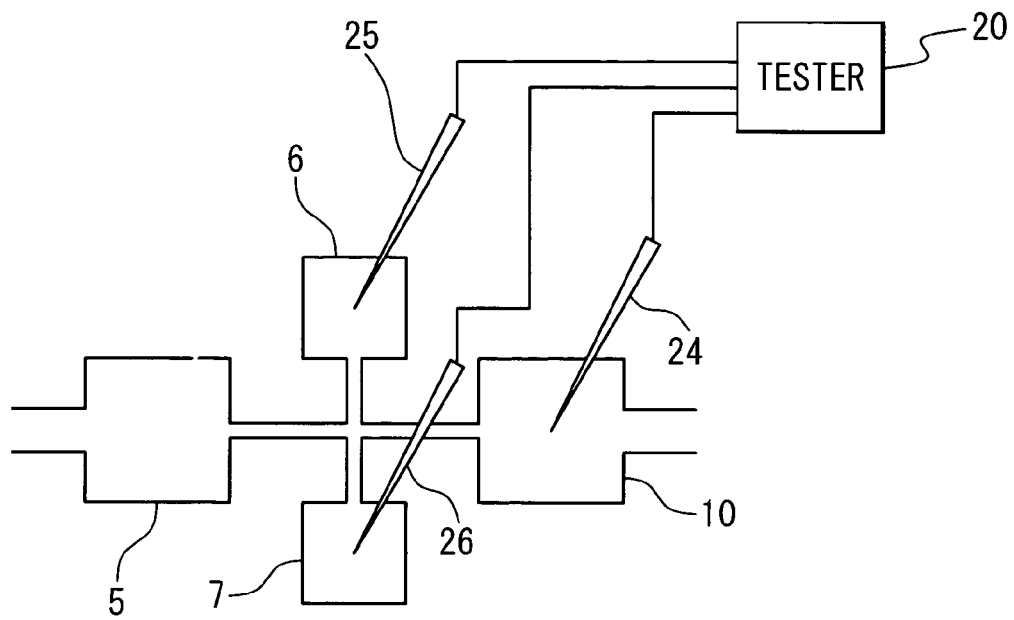
FIG. 7 is a conceptual diagram illustrating a contact resistance measurement method in another alternative embodiment.

FIG. 5 is a conceptual diagram illustrating a method for measuring a contact resistance r4 related to one of the bonding pads 10 within the chip area 8. A probe 24 is additionally placed on the bonding pad 10 with the probe 21 placed on the associated bonding pad 5, and with the auxiliary probes 22 and 23 placed on the associated auxiliary pads 6 and 7. As shown in FIG. 6, the resistance R4 between the probe 24 and the auxiliary probe 22 and the resistance R5 between the probe 24 and the auxiliary probe 23 are then measured in addition to the aforementioned resistances R1 to R3. Two of the four probes which are not involved with the measurement are placed into the high-impedance state.

The measured resistances R4 and R5 depend on the contact resistances r2, r3 and r4, expressed by as follows:

$$R4 = r4 + r2, \quad (5a)$$

$$R5 = r3 + r4. \quad (5b)$$

The contact resistance r4 between the bonding pad 10 and the probe 24 is calculated from the following equation (6), which is obtained from the equation (1b), (5a), and (5b):

$$r4=(-R_2+R_4+R_5)/2. \qquad (6)$$

As thus described, the contact resistance measurement method in this embodiment allows the auxiliary pads 6 and 7 to be commonly used for contact resistance measurements related to the bonding pads 5 within the chip area 2, and to the bonding pads 10 within the chip area 8.

Figure 8:
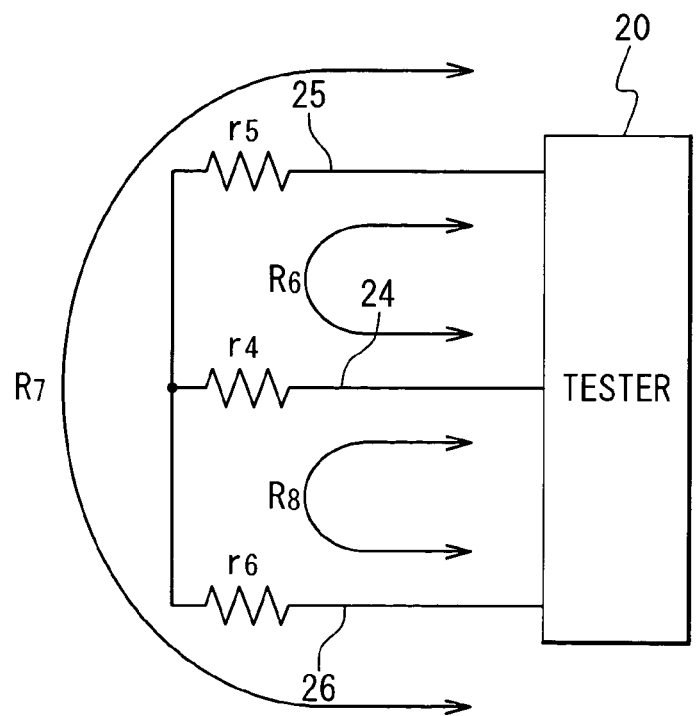
FIG. 8 is a circuit diagram illustrating the contact resistance measurement method in the other alternative embodiment.

In another alternative embodiment, other auxiliary probes 25 and 26 may be placed on the auxiliary pads 6 and 7 for the contact resistance measurement related to bonding pads 10 in place of the auxiliary probes 22 and 23. In this embodiment, as shown in FIG. 8, the contact resistance r4 between the bonding pad 10 and the associated probe 24 is obtained from the following measured resistances: the resistance R6 between the probe 24 and the auxiliary probe 25, the resistance R7 between the auxiliary probes 25 and 26, and the resistance R8 between the auxiliary probe 26 and the probe 24. Specifically, the contact resistance r4 is calculated from the following equation (7):

$$r4=(R6-R7+R8)/2. \qquad (7)$$

The procedure of obtaining the equation (7) is similar to that of obtaining the equation (3), as is apparent to those skilled in the art. Those skilled in the art would appreciate that the contact resistance measurement in this embodiment allows obtaining necessary data for calculating the contact resistance r5 between the auxiliary pad 6 and the auxiliary probe 25, and the contact resistance r6 between the auxiliary pad 7 and the auxiliary probe 26.

In summary, the above-described contact resistance measuring methods achieves contact resistance measurement between a probe and a bonding pad used for signal interface to an integrated circuit, obtaining necessary data for calculating the contact resistances between auxiliary pads and auxiliary probes, used for the contact resistance measurement. Furthermore, the pad arrangement shown in FIG. 4 effectively reduces the total size of the auxiliary pads necessary for achieving the contact resistance measurement.

It is apparent that the present invention is not limited to the above-described embodiments, which may be modified and changed without departing from the scope of the invention.

What is claimed is:

1. A contact resistance measurement method comprising:
   placing a first probe on a first pad connected to an integrated circuit;
   placing a second probe on a second pad electrically connected to said first pad;
   placing a third probe on a third pad electrically connected to said first pad;
   measuring a first resistance between said first and second probes;
   measuring a second resistance between said second and third probes;
   measuring a third resistance between said third and first probes; and
   calculating a contact resistance between said first probe and said first pad from said first to third resistances.

2. The contact resistance measurement method according to claim 1, further comprising:
   calculating a contact resistance between said second probe and said second pad from said first to third resistances.

3. The contact resistance measurement method according to claim 1, further comprising:
   placing a fourth probe on a fourth pad connected to another integrated circuit, said fourth pad being electrically connected to said second and third pads;
   measuring a fourth resistance between said fourth and second probes;
   measuring a fifth resistance between said third and fourth probes; and
   calculating a contact resistance between said fourth probe and said fourth pad from said second, fourth, and fifth resistances.

4. The contact resistance measurement method according to claim 3, wherein at least portions of said second and thirds pads are disposed within a scribe lane disposed to separate said integrated circuit and said another integrated circuit.

5. The contact resistance measurement method according to claim 1, further comprising:
   placing a fourth probe on a fourth pad connected to another integrated circuit, said fourth pad being electrically connected to said second and third pads;
   placing a fifth probe on said second pad;
   placing a sixth probe on said third pad;
   measuring a sixth resistance between said fourth and fifth probes;
   measuring a seventh resistance between said fifth and sixth probes;
   measuring an eighth resistance between said sixth and forth probes; and
   calculating a contact resistance between said fourth probe and said fourth pad from said sixth to eighth resistances.

6. The contact resistance measurement method according to claim 5, wherein at least portions of said second and thirds pads are disposed in a scribe lane disposed to separate said integrated circuit and said another integrated circuit.

7. A contact resistance measurement apparatus comprising:
   a first probe to be placed on a first pad connected to an integrated circuit;
   a second probe to be placed on a second pad electrically connected to said first pad;
   a third probe to be placed on a third pad electrically connected to said first pad; and
   a tester connected to said first to third probes, wherein said tester is designed to measure a first resistance between said first and second probes, a second resistance between said second and third probes, and a third resistance between said third and first probes, and to calculate a contact resistance between said first probe and said first pad from said first to third resistances.

8. The contact resistance measurement apparatus according to claim 7, wherein said tester is designed to calculate a contact resistance between said second probe and second pad from said first to third resistances.

9. The contact resistance measurement apparatus according to claim 7, further comprising:
   a fourth probe to be connected to a fourth pad connected to another integrated circuit, said fourth pad being electrically connected to said second and third pads;
   wherein said tester is designed to measure a fourth resistance between said fourth and second probes and a fifth resistance between said third and fourth probes, and to calculate a contact resistance between said fourth probe and said fourth pad from said second, fourth, and fifth resistances.

10. The contact resistance measurement apparatus according to claim 7, further comprising:
   a fourth probe to be connected to a fourth pad connected to another integrated circuit, said fourth pad being electrically connected to said second and third pads;
   a fifth probe to be connected to said second pad;
   a sixth probe to be connected to said third pad;

wherein said tester is designed to measure a sixth resistance between said fourth and fifth probes, a seventh resistance between said fifth and sixth probes, and an eighth resistance between said sixth and said fourth probes, and to calculate a contact resistance between said fourth probe and said fourth pad from said sixth to eighth resistances.

\* \* \* \* \*